(12) United States Patent
Fulford et al.

(10) Patent No.: US 11,251,159 B2
(45) Date of Patent: Feb. 15, 2022

(54) HIGH PERFORMANCE CMOS USING 3D DEVICE LAYOUT

(71) Applicant: Tokyo Electron Limited, Tokyo (JP)

(72) Inventors: H. Jim Fulford, Marianna, FL (US); Mark I. Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/841,648

(22) Filed: Apr. 6, 2020

(65) Prior Publication Data

US 2021/0175209 A1 Jun. 10, 2021

Related U.S. Application Data

(60) Provisional application No. 62/944,947, filed on Dec. 6, 2019.

(51) Int. Cl.
| | | |
|---|---|---|
| *H01L 25/065* | (2006.01) | |
| *H01L 21/8234* | (2006.01) | |
| *H01L 25/00* | (2006.01) | |
| *H01L 29/423* | (2006.01) | |
| *H01L 29/08* | (2006.01) | |
| *H01L 21/02* | (2006.01) | |
| *H01L 23/00* | (2006.01) | |
| *H01L 29/10* | (2006.01) | |
| *H01L 29/06* | (2006.01) | |
| *H01L 27/088* | (2006.01) | |

(52) U.S. Cl.
CPC .... *H01L 25/0657* (2013.01); *H01L 21/02532* (2013.01); *H01L 21/823475* (2013.01); *H01L 24/19* (2013.01); *H01L 24/24* (2013.01); *H01L 24/82* (2013.01); *H01L 25/50* (2013.01); *H01L 27/0886* (2013.01); *H01L 29/0673* (2013.01); *H01L 29/0847* (2013.01); *H01L 29/1037* (2013.01); *H01L 29/42392* (2013.01); *H01L 2224/24145* (2013.01); *H01L 2225/06524* (2013.01); *H01L 2225/06565* (2013.01)

(58) Field of Classification Search
CPC ............ H01L 25/0657; H01L 21/6835; H01L 21/8221; H01L 24/83; H01L 25/18; H01L 24/94; H01L 27/0688
See application file for complete search history.

(56) References Cited

U.S. PATENT DOCUMENTS

| | | |
|---|---|---|
| 9,219,077 B2 | 12/2015 | Yokoyama |
| 9,419,016 B2 | 8/2016 | Bajaj et al. |
| 9,419,115 B2 | 8/2016 | Bajaj et al. |
| 9,711,535 B2 | 7/2017 | Wang et al. |

(Continued)

FOREIGN PATENT DOCUMENTS

WO WO 2017/052594 A1 3/2017

OTHER PUBLICATIONS

International Search Report and Written Opinion dated Mar. 5, 2021 in PCT/US2020/059845, 10 pages.

*Primary Examiner* — Changhyun Yi
(74) *Attorney, Agent, or Firm* — Oblon, McClelland, Maier & Neustadt, L.L.P.

(57) ABSTRACT

A semiconductor device includes an NMOS device formed on a first substrate bonded with a second substrate having a PMOS device formed thereon, with the bonding achieved by contacting a first wiring layer formed on the NMOS device with a second wiring layer formed on the PMOS device.

12 Claims, 24 Drawing Sheets

(56) References Cited

U.S. PATENT DOCUMENTS

| | | |
|---|---|---|
| 9,780,075 B2 | 10/2017 | Das et al. |
| 9,837,534 B2 | 12/2017 | Yokoyama |
| 10,079,224 B2 | 9/2018 | Das et al. |
| 10,229,897 B2 | 3/2019 | Das |
| 10,340,247 B2 | 7/2019 | Lin |
| 10,361,220 B2 | 7/2019 | Wang et al. |
| 10,418,350 B2 | 9/2019 | Das et al. |
| 2012/0248544 A1 | 10/2012 | Yokoyama |
| 2016/0056291 A1* | 2/2016 | Yokoyama ............ H01L 29/165 257/77 |
| 2016/0133648 A1 | 5/2016 | Bajaj et al. |
| 2016/0133730 A1 | 5/2016 | Bajaj et al. |
| 2016/0268312 A1 | 9/2016 | Wang et al. |
| 2017/0162507 A1 | 6/2017 | Das et al. |
| 2017/0162550 A1 | 6/2017 | Das et al. |
| 2017/0194248 A1 | 7/2017 | Das |
| 2017/0200700 A1 | 7/2017 | Das et al. |
| 2017/0317109 A1 | 11/2017 | Wang et al. |
| 2019/0341403 A1 | 11/2019 | Wang et al. |
| 2020/0235098 A1* | 7/2020 | Li ....................... H01L 27/0207 |

* cited by examiner

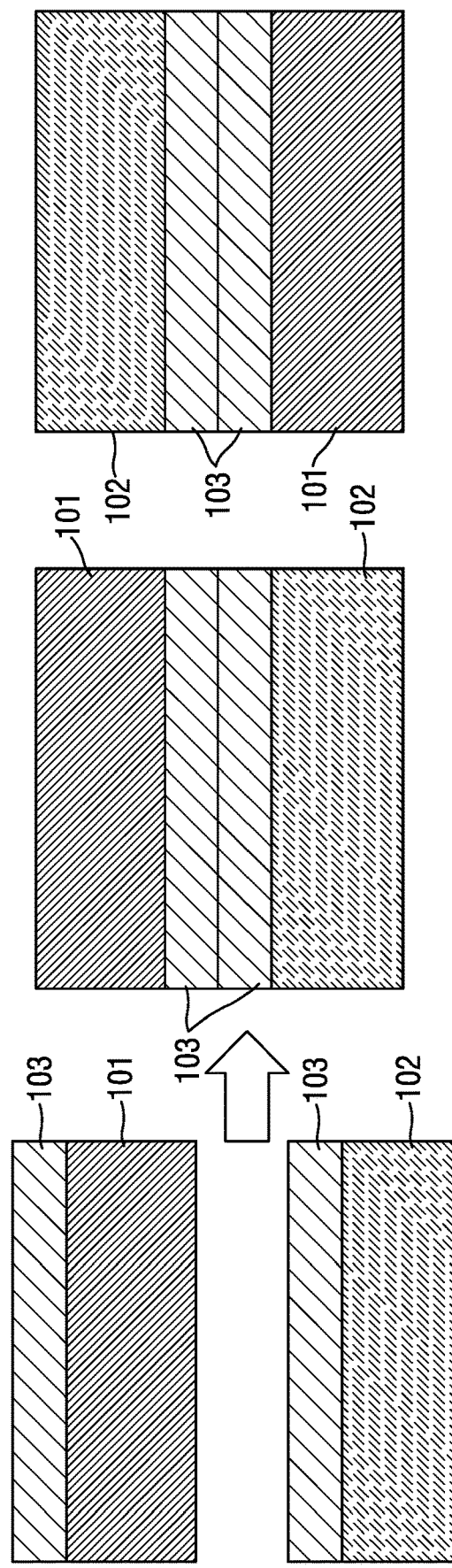

HIGH PERFORMANCE CMOS USING 3D DEVICE LAYOUT

CROSS REFERENCE TO RELATED APPLICATIONS

This application is based on and claims the benefit of and priority to U.S. Provisional Patent Application No. 62/944,947, entitled "HIGH PERFORMANCE CMOS USING 3D DEVICE LAYOUT", filed on Dec. 6, 2019, the entire contents of which are herein incorporated by reference.

BACKGROUND

Technical Field

This disclosure relates to integrated circuits and the fabrication of microelectronic devices, including semiconductor devices, transistors, and integrated circuits. More particularly, it relates to manufacturing of three-dimensional (3D) transistors.

Description of the Related Art

In the manufacturing of a semiconductor device (especially on the microscopic scale), various fabrication processes are executed, such as, film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for 3D semiconductor circuits in which transistors are stacked on top of each other.

3D integration is seen as a viable option to continue semiconductor scaling in spite of inevitable saturation in critical dimension scaling. As the contacted gate pitch reaches its scaling limit due to manufacturing variability and electrostatic device limitations, two dimensional transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e. the vertical stacking of multiple devices, aims to overcome these scaling limitations by increasing transistor density in volume rather than area. Device stacking has been successfully demonstrated and implemented by the flash memory industry with the adoption of 3D NAND devices. Mainstream CMOS VLSI scaling, as used for example in CPU (central processing unit) or GPU (graphics processing unit) products, is exploring adoption of 3D integration as a primary means of moving the semiconductor roadmap forward, and thus desires enabling technologies.

SUMMARY

Disclosure herein includes 3D CMOS high performance devices as well as a method of fabricating high-performance 3D CMOS devices using reduced silicon area and substrate building blocks.

In particular, the techniques described herein provide multiple 3D nano-sheets having significant performance increases in IDsat (optimum drive current), speed, and lower power consumption. PMOS devices of the 3D CMOS devices use germanium or SiGe on silicon for significant boost in circuit performance.

A first silicon substrate is used to form NMOS regions and a second silicon substrate is used to form PMOS regions. These substrates can include NMOS regions and PMOS regions with several nano-sheets (stack of layers). Combining two wafers generates very high mobility optimized NMOS and PMOS devices. In one embodiment, channels use a same high doping level as the S/D regions. The 3D CMOS devices may have 1 to 6 or more nano-sheets. Substrate building blocks may use three blocks or more by adding a new metal X routing layer to a bonded wafer pair. Techniques herein provide any combination of NMOS and/or PMOS stacking with improved performance.

The order of the different steps as described herein is presented for clarity sake. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the features of the present application can be embodied and viewed in many different ways.

This summary section does not specify every embodiment and/or novel aspect of the present application. Instead, this summary only provides a preliminary discussion of different embodiments and corresponding points of novelty over conventional techniques. Additional details and/or possible perspectives of the disclosed embodiments are described in the Detailed Description section and corresponding Figures of the present disclosure as further discussed below.

BRIEF DESCRIPTION OF THE DRAWINGS

The application will be better understood in light of the description which is given in a non-limiting manner, accompanied by the attached drawings in which:

FIGS. 1A-1C show a schematic of connecting substrates having PMOS and NMOS devices.

FIG. 25 shows power rails added down the middle of the PMOS substrate.

DETAILED DESCRIPTION OF THE PREFERRED EMBODIMENTS

Figure 2A:
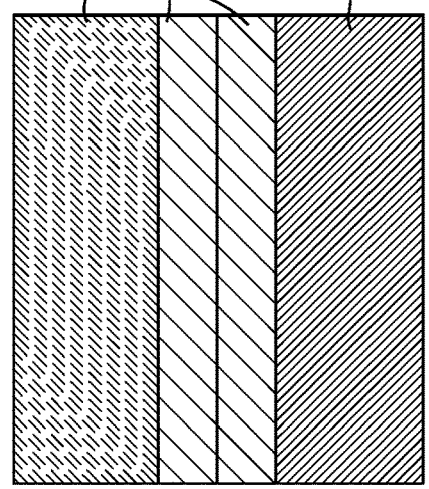
FIGS. 2A-2C and 3A-3C show a schematic of connecting substrates having different combinations of PMOS and NMOS devices.
Figure 2B:
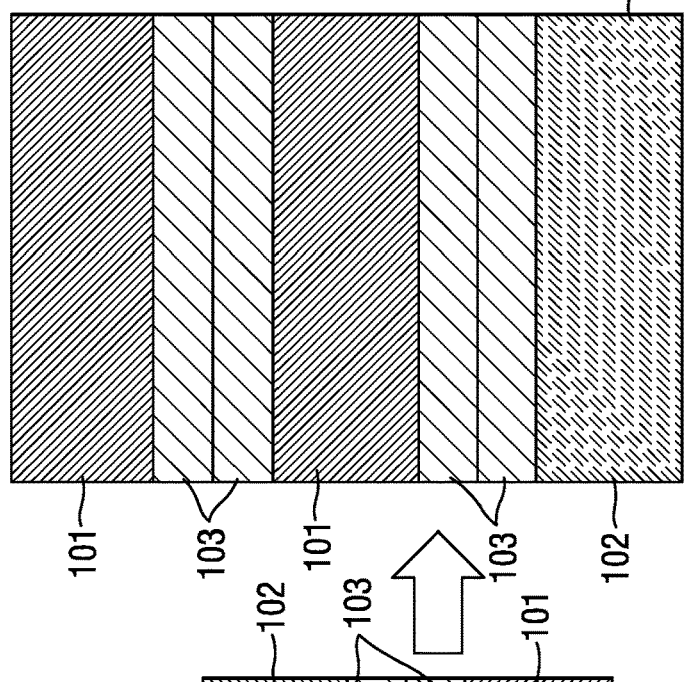
Figure 2C:
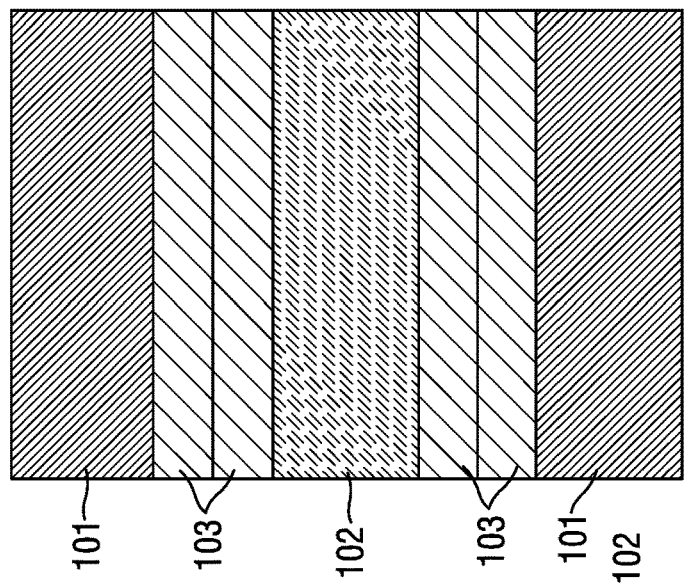

Reference throughout this specification to "one embodiment" or "an embodiment" means that a particular feature, structure, material, or characteristic described in connection with the embodiment is included in at least one embodiment of the application, but do not denote that they are present in every embodiment.

Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

Disclosure herein includes 3D CMOS high performance devices as well as a method of fabricating high-performance 3D CMOS devices using reduced silicon area and substrate building blocks. In one embodiment, a first silicon substrate is used to form NMOS regions. This first substrate can include NMOS regions with several nano-sheets (stack of layers) finished through a metal x process that is integrated with a silicon substrate using (Ge or SiGe) nano-sheets through metal 1 for PMOS transistors. A nano-sheet has a relatively small cross section (less than a micron and typically less than 30 nanometers), but with a cross section that is rectangular. A given nano-sheet can include rounded corners. Embodiments can include N=1 to N=6 nano-sheets or more. Moreover, nano-sheets' source/drain (S/D) doping can be the same as doping for the channel regions. Example embodiments in the Figures both use N=4 nano-sheets. In another embodiment, a process flow can have N=1 to N=6 or more nano-sheets, and the S/D region is heavily doped while a corresponding channel is undoped. Substrates can be Si (for NMOS Si nano-sheets and Si for a PMOS substrate using Ge or SiGe nano-sheets as examples. In an alternative embodiment, a silicon substrate is used for PMOS but can grow either Si for PMOS 3D devices. Substrate building blocks can use N stacks with any combination of NMOS or PMOS.

FIG. 1A shows a first substrate (Block 1) and a second substrate (Block 2) prior to bonding/joining. Block 1 can be a silicon wafer with n-channel/n-type metal-oxide-semiconductor field-effect transistor (NMOS) devices 101 formed thereon. NMOS devices 101 can be completed through metal X routing 103. In this example, FIG. 1A shows two silicon nano-sheets, while FIG. 1B shows four silicon nano-sheets after bonding. FIG. 1A shows a second substrate (Block 2) which can be silicon and use either Ge or SiGe nano-sheets. p-channel/p-type metal-oxide-semiconductor field-effect transistor (PMOS) devices 102 can be completed through metal X routing 103. For example, NMOS devices can be formed on a first wafer, and then PMOS devices can be formed on a second wafer. Forming NMOS and PMOS devices on separate wafers can be advantageous because each device type does not need to be masked while the other device type is being doped. Also, annealing and other processes do not interfere with each other.

Figure 3A:
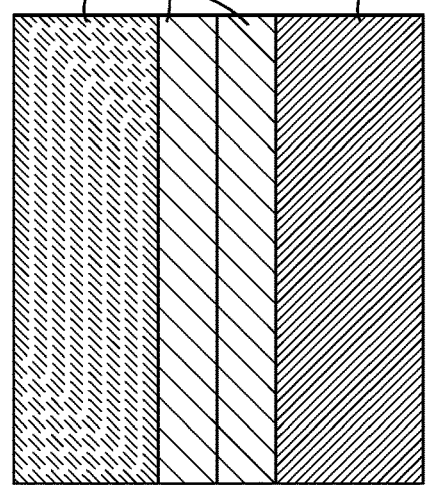

With each substrate (or block or segment) having completed NMOS and PMOS devices and a number of metal routing layers, the substrates are bonded or connected to each other by bonding corresponding metal layers. Two or more levels of local interconnects can be optionally used. FIG. 1B and FIG. 1C illustrate this. In FIG. 1B, 3D CMOS devices use integrated channel and S/D regions of a same highly-doped grown epitaxial material for both NMOS and PMOS. In FIG. 1C, 3D CMOS devices have undoped channels and highly doped S/D regions.

Various techniques can be used for bonding wafers together. For example, bonding techniques can be used that are described in U.S. Patent Application Ser. No. 62/901,591, filed on Sep. 17, 2019 entitled: "High Density Logic and Memory Formation for Advanced Circuit Architecture", which is incorporated herein by reference in its entirety. Moreover, metal layers may include pads or enlarged connection points to assist with alignment and connection of two or more wafers.

Figure 3B:
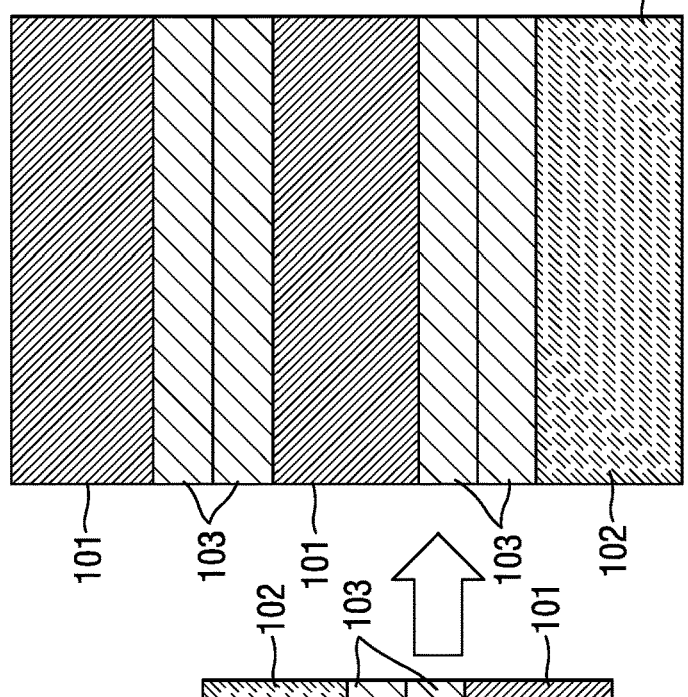
Figure 3C:
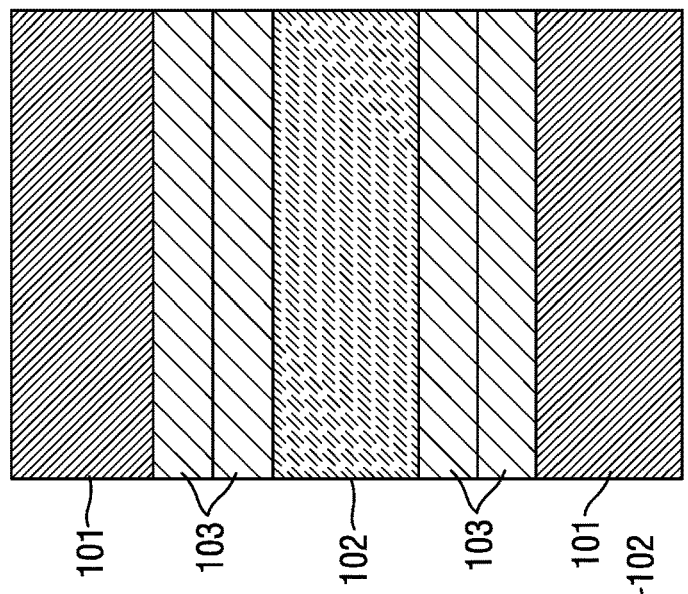

Other embodiments include combinations of stacking the different substrates. FIGS. 2A-2C and FIGS. 3A-3C show that a building block of two wafers or two blocks (NMOS and PMOS) can have a third or additional substrate bonded thereon. This can include adding a new metal X routing layer 103 to at least one side of the combined two-block substrate from FIGS. 2A and 3A. Note that either an NMOS or a PMOS additional substrate can be added. For example, a bonded substrate can then have two NMOS 101 and one PMOS 102, or two PMOS 102 and one NMOS 101. Stacking can continue beyond three wafers with any combination of NMOS 101 or PMOS 102, as seen in FIGS. 3B and 3C.

Figure 4:
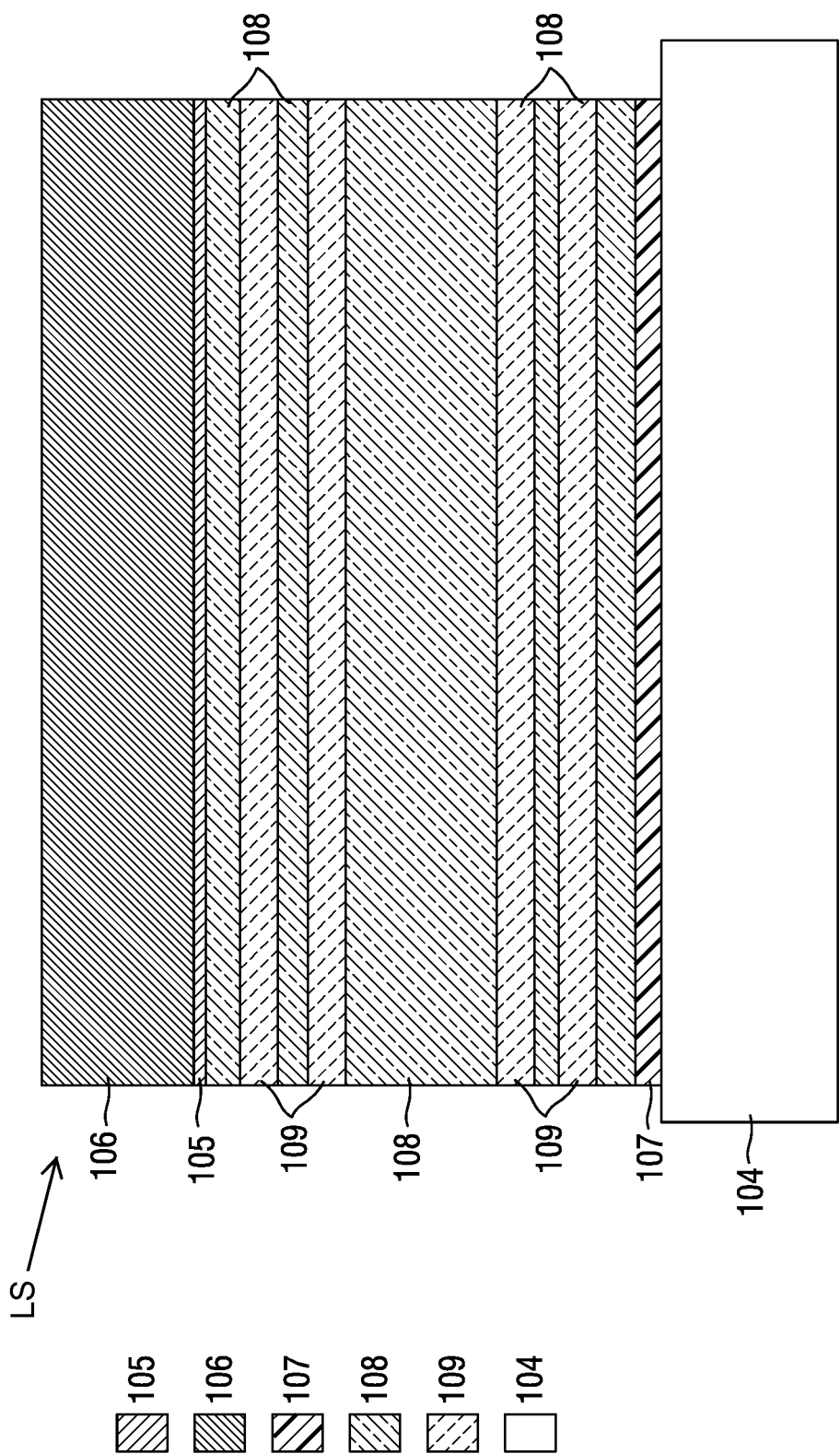
FIGS. 4-13 show a process flow for forming an NMOS substrate.

In FIGS. 4-22, non-limiting examples of the various layers of the stacks are as follows.
104: silicon
105: oxide TEOS
106: nitridePECVD
107: SiGe65
108: SiGe
109: N+Si epi (As or P)
110: SiOC
111: oxidePMD
112: LowK
113: AlO
114: Ru
115: silicon
116: oxide
117: dielectric
118: nitride
119: silicon
120: Boron P+ EPI GPI Ge or $Si_xGe_y$
121: $Si_xGe_y$
122: aSi
123: Ru FIG. 4 shows a layer stack LS formed on silicon 104. A number of semiconductor layers of different composition are epitaxially grown on a substrate. This stack of layers is capped with an oxide layer 105 and a nitride layer 106. Epitaxial layers can be grown for Si phosphorous or Si arsenic doped for NMOS (future NMOS S/D and channel regions having a same doping). FIG. 4 shows four N+ silicon nano-sheets, but a number of silicon N+ layers can be 1-6 or more.

Figure 5:
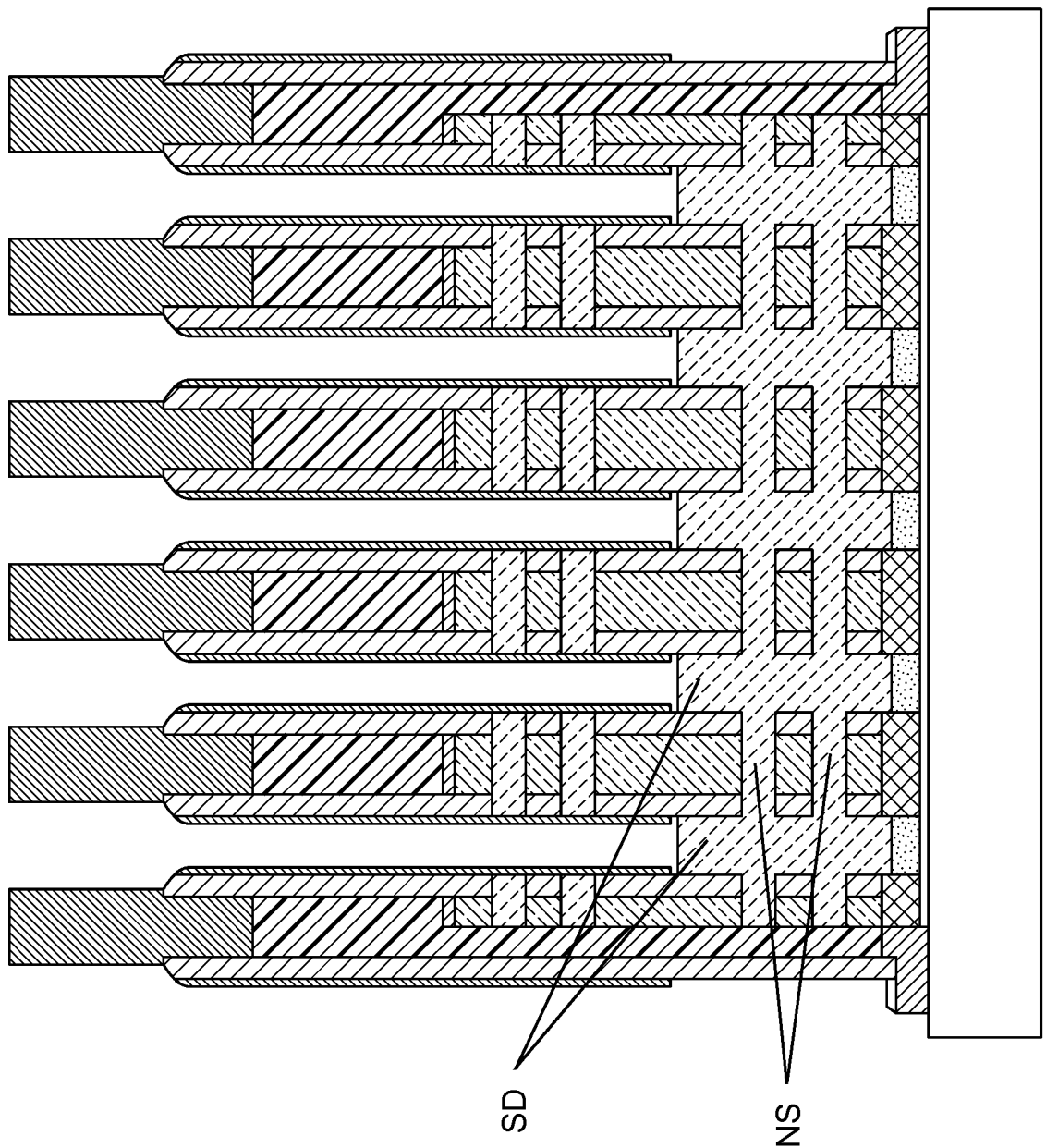

FIG. 5 shows a partially formed NMOS 3D device after SiP or As N+ S/D epitaxial grown regions are formed. In the bottom planes, adjacent S/D regions are connected with the bottom of two nano-sheets NS. Alternatively, S/D is grown/extended but not connected. Prior steps may include forming buried power rails, shallow trench isolation, dummy gate, sacrificial spacer, inner spacer formation, P-epi top tier encapsulation.

Figure 6:
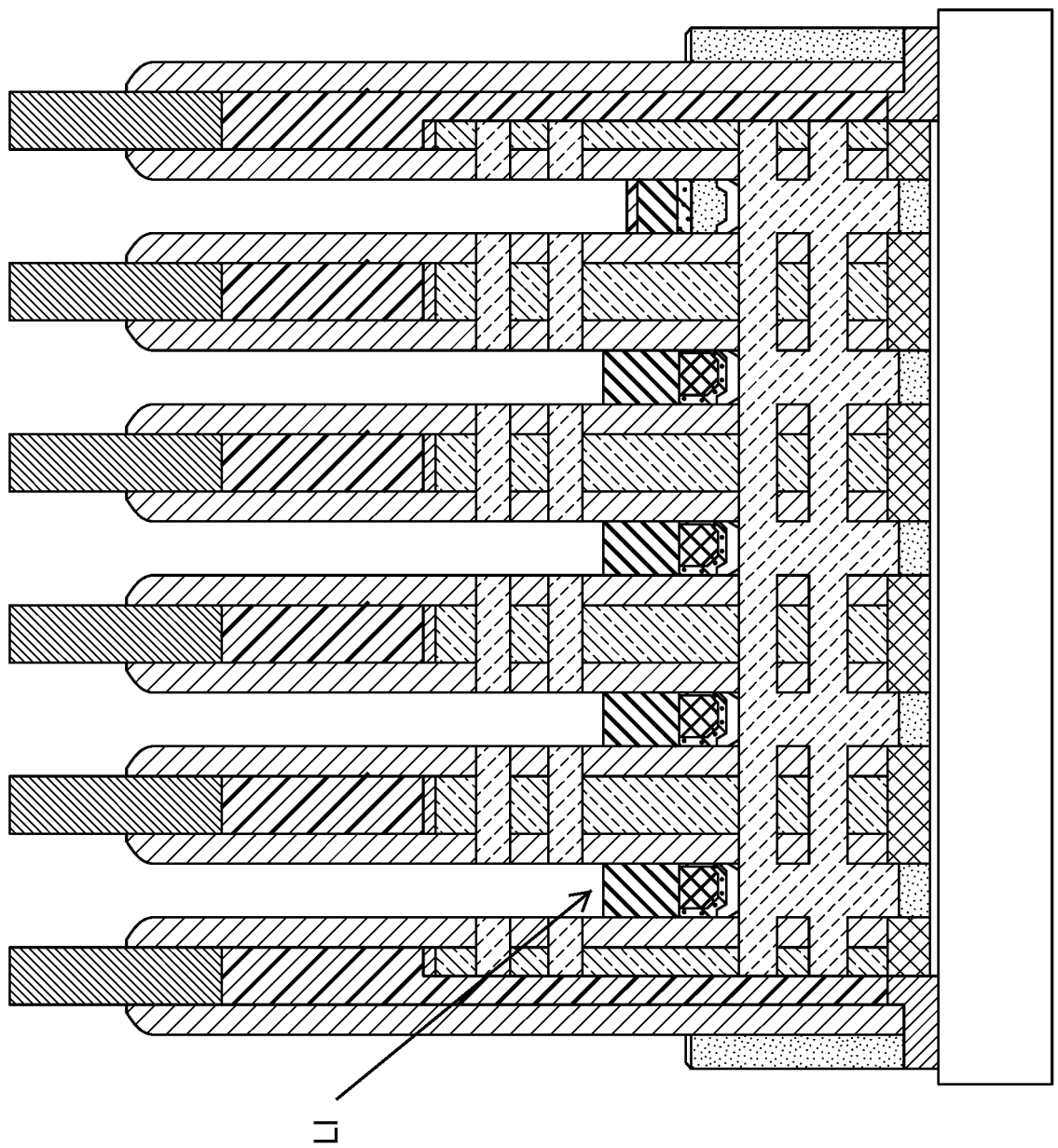
Figure 7:
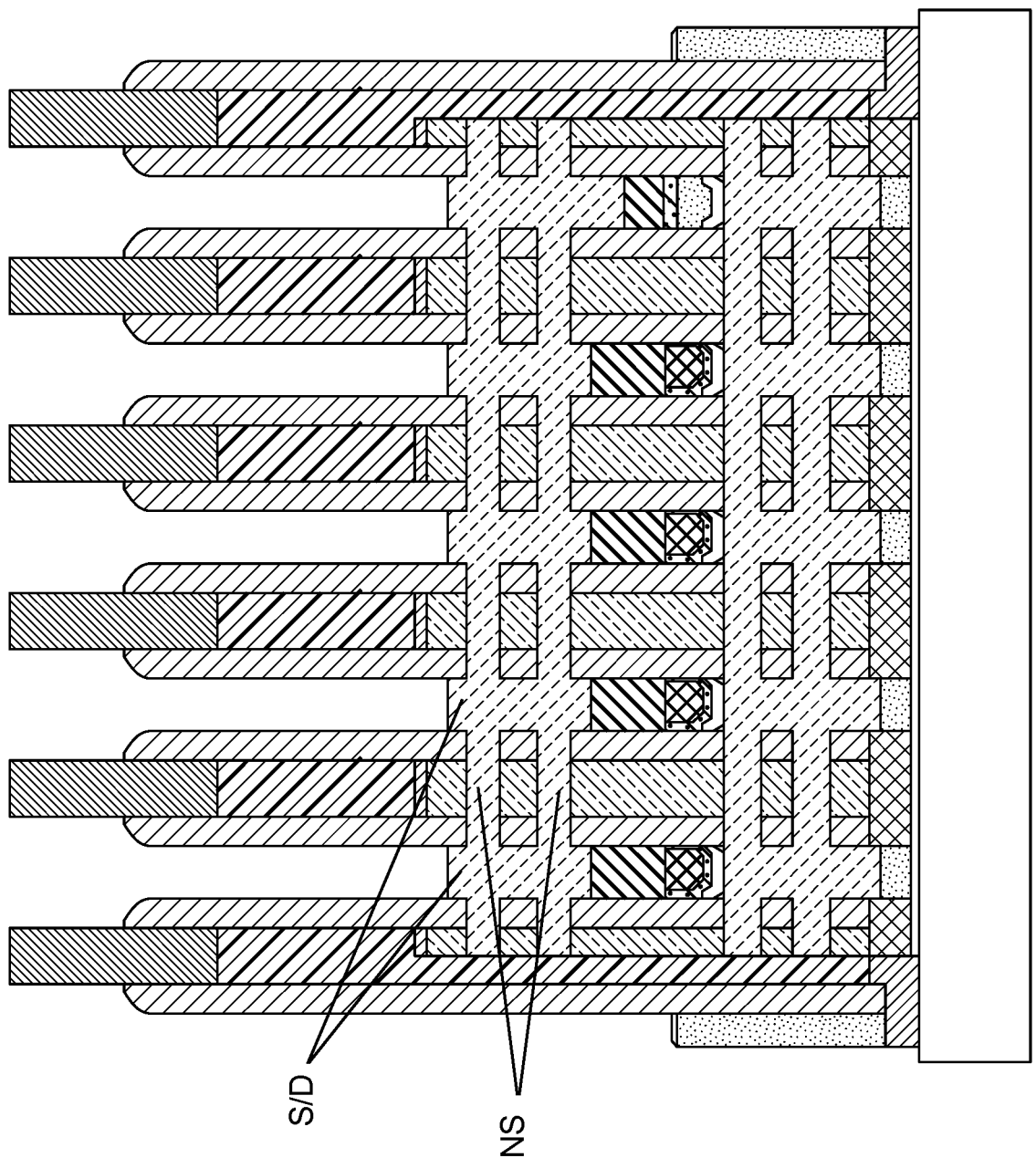
Figure 8:
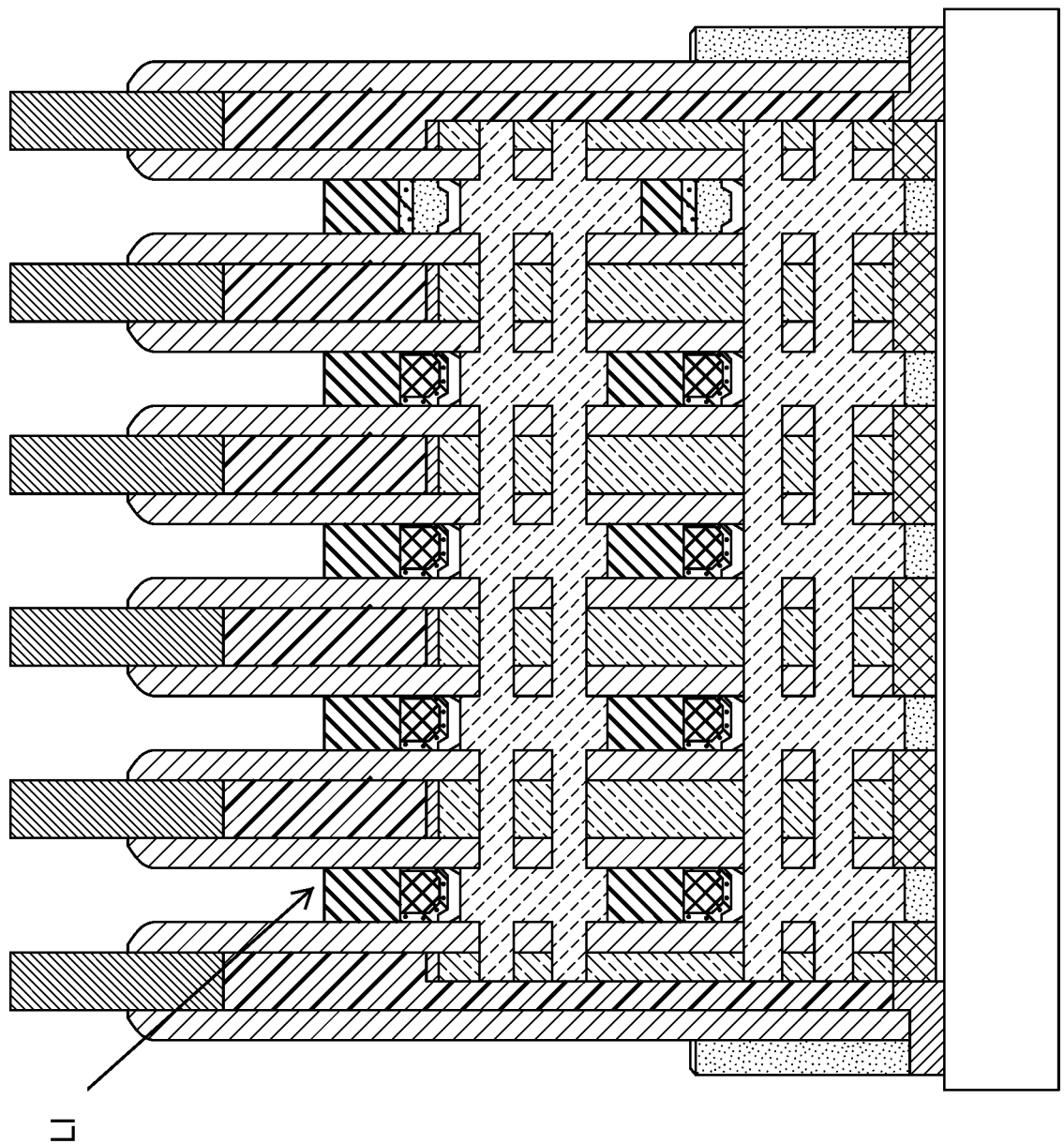
Figure 9:
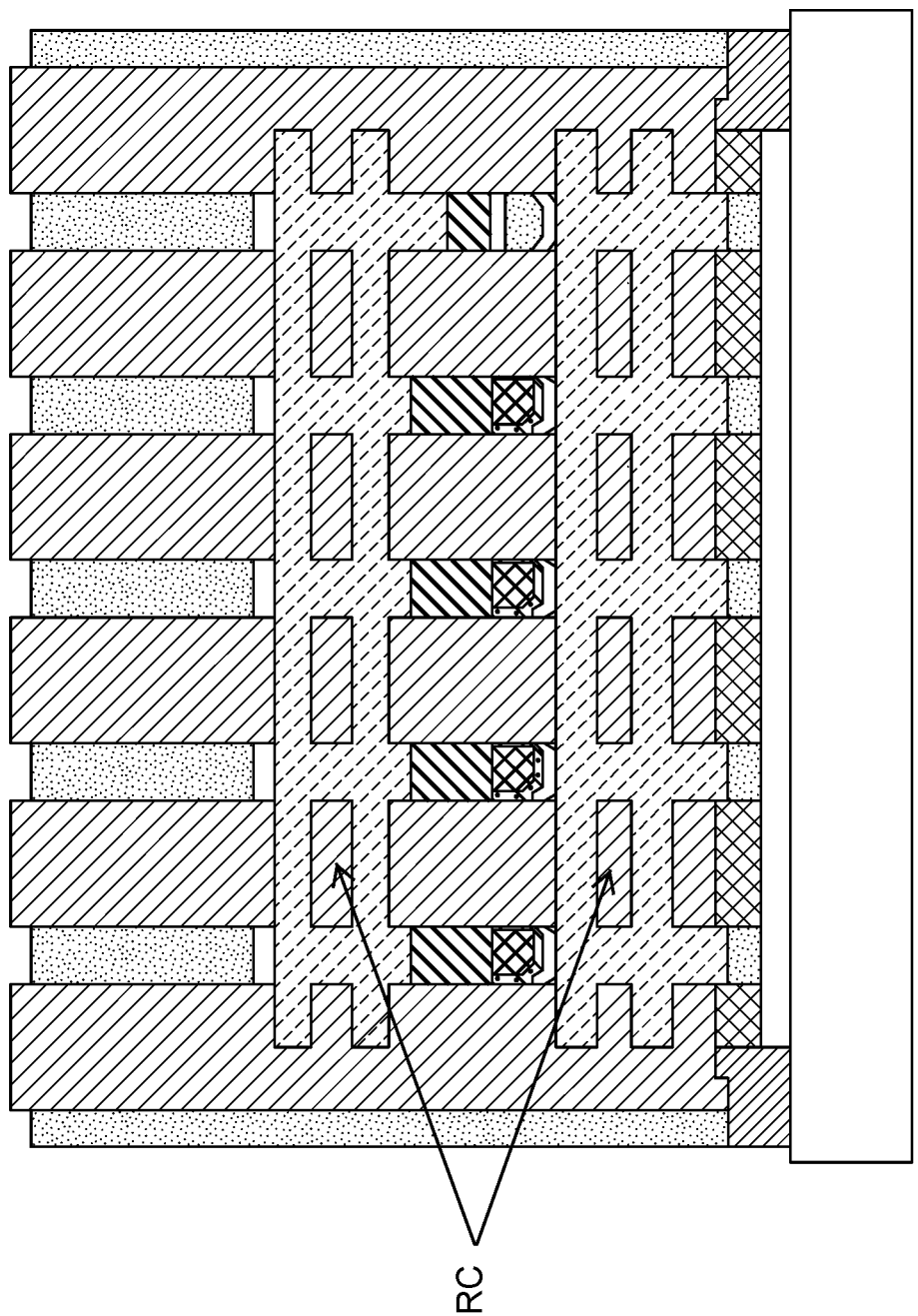
Figure 10:
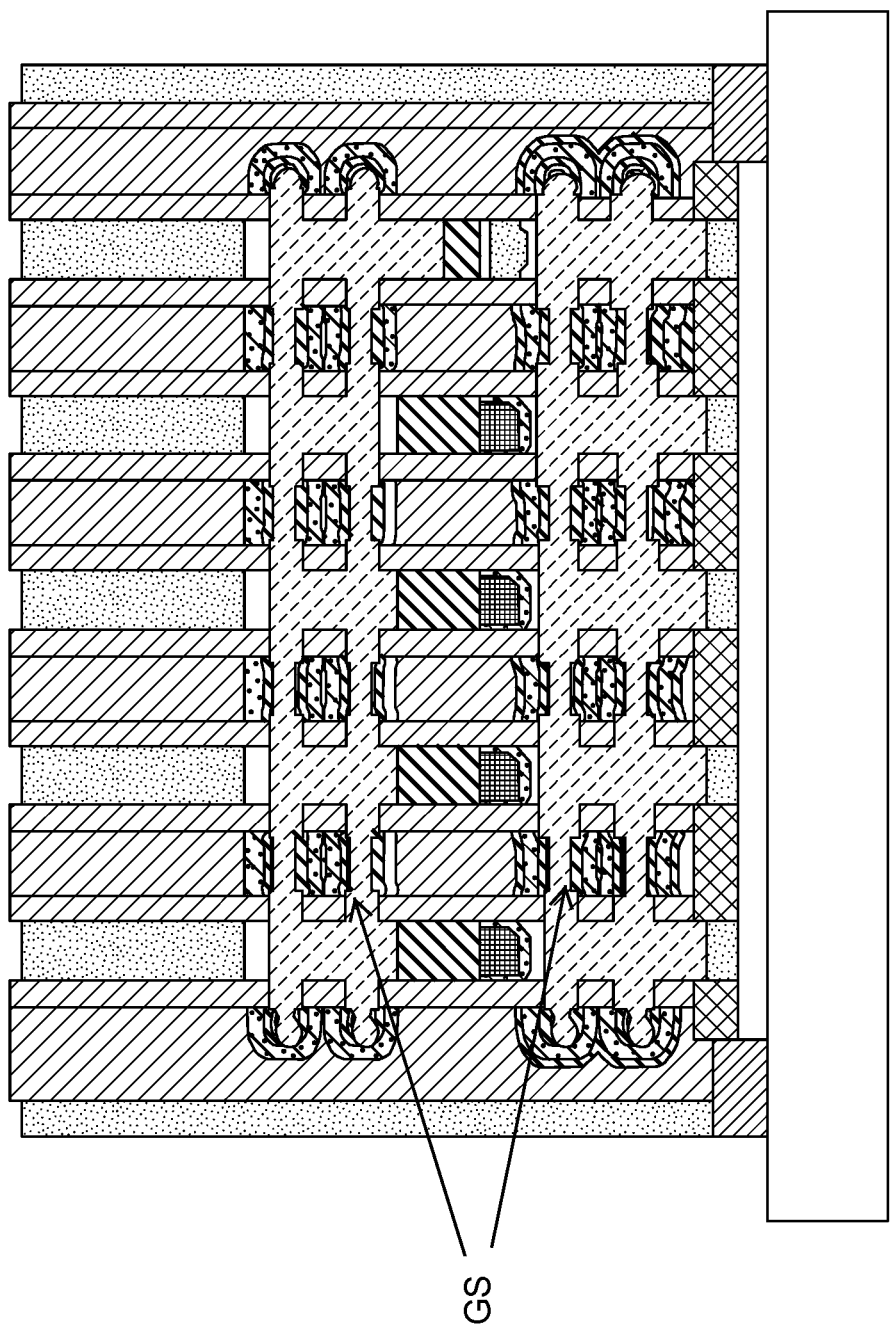
Figure 11:
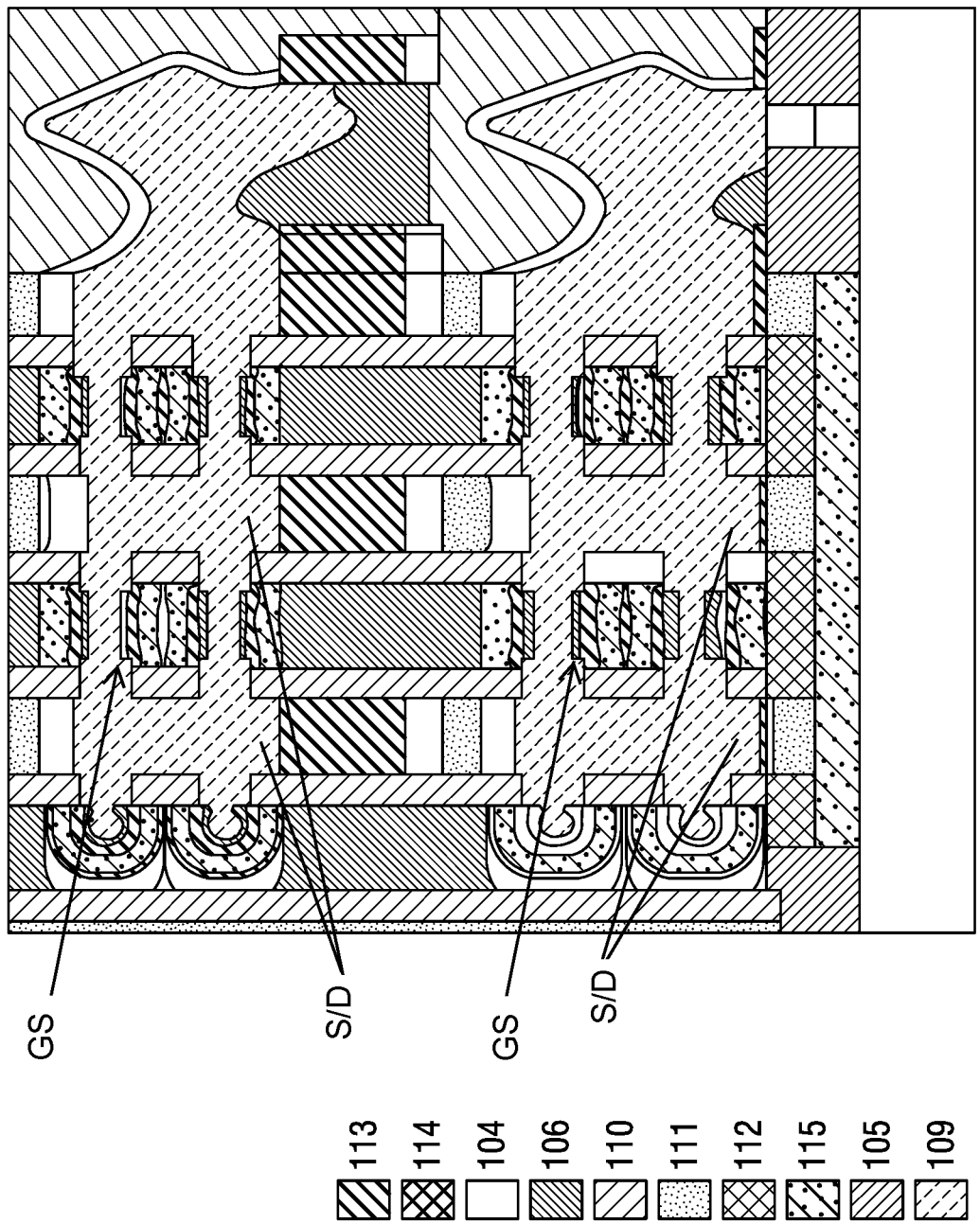

FIG. 6 shows local interconnect LI formation for the lower channels. Then, sidewall liner is removed from upper Si channels (top two Si nano-sheets NS) and N+ S/D regions are epitaxially grown (FIG. 7). Adjacent S/D regions can be merged or be grown without being connected. Local interconnects LI can then be formed on upper channels (FIG. 8). SiGe can then be removed (etched) to release channels RC (FIG. 9), and then gate stacks GS with high-k/metal deposition (TiN, TaN) can be formed on channels for NMOS devices (FIG. 10). A final cross section is shown in FIG. 11.

Figure 12:
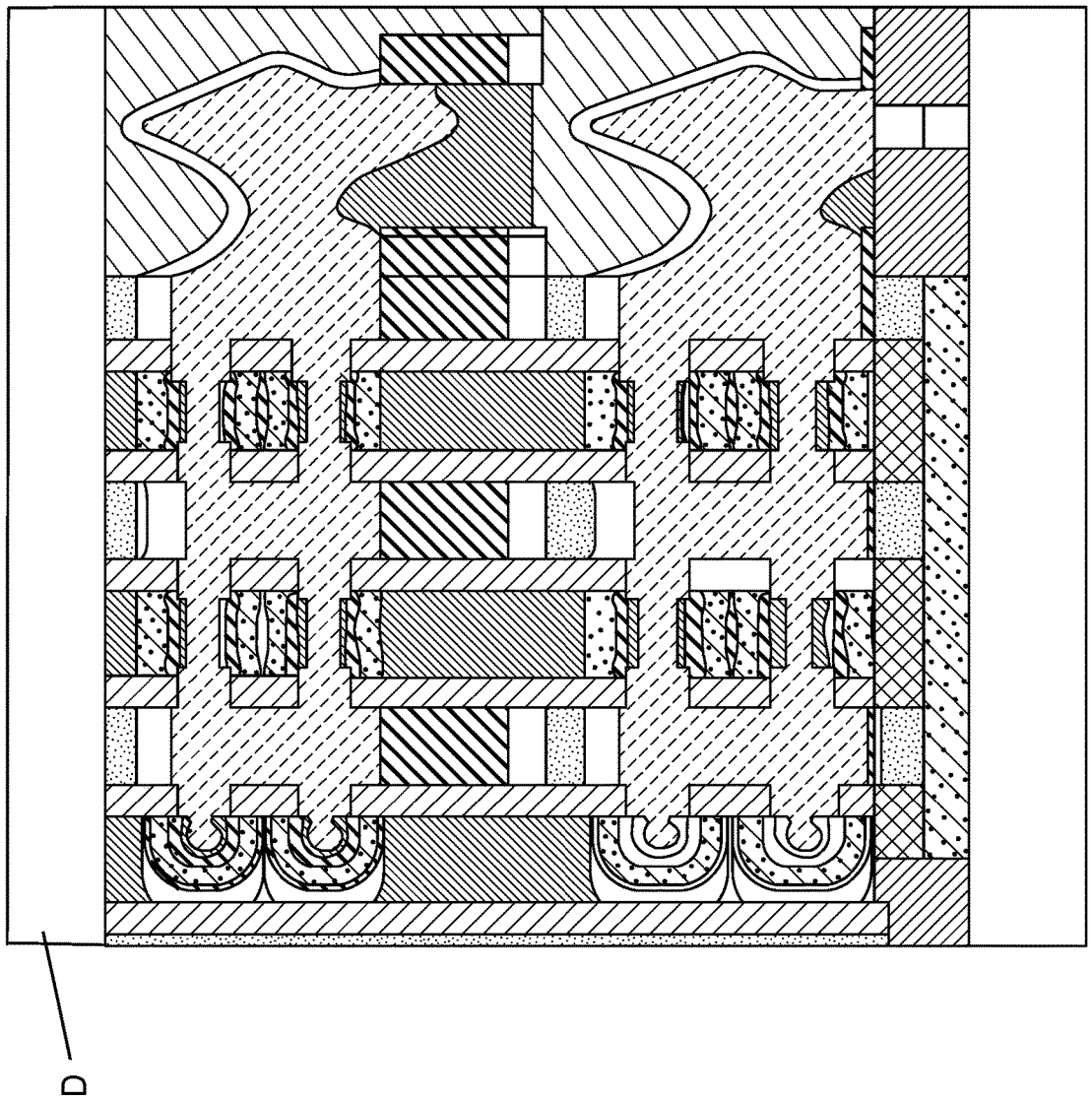
Figure 13:
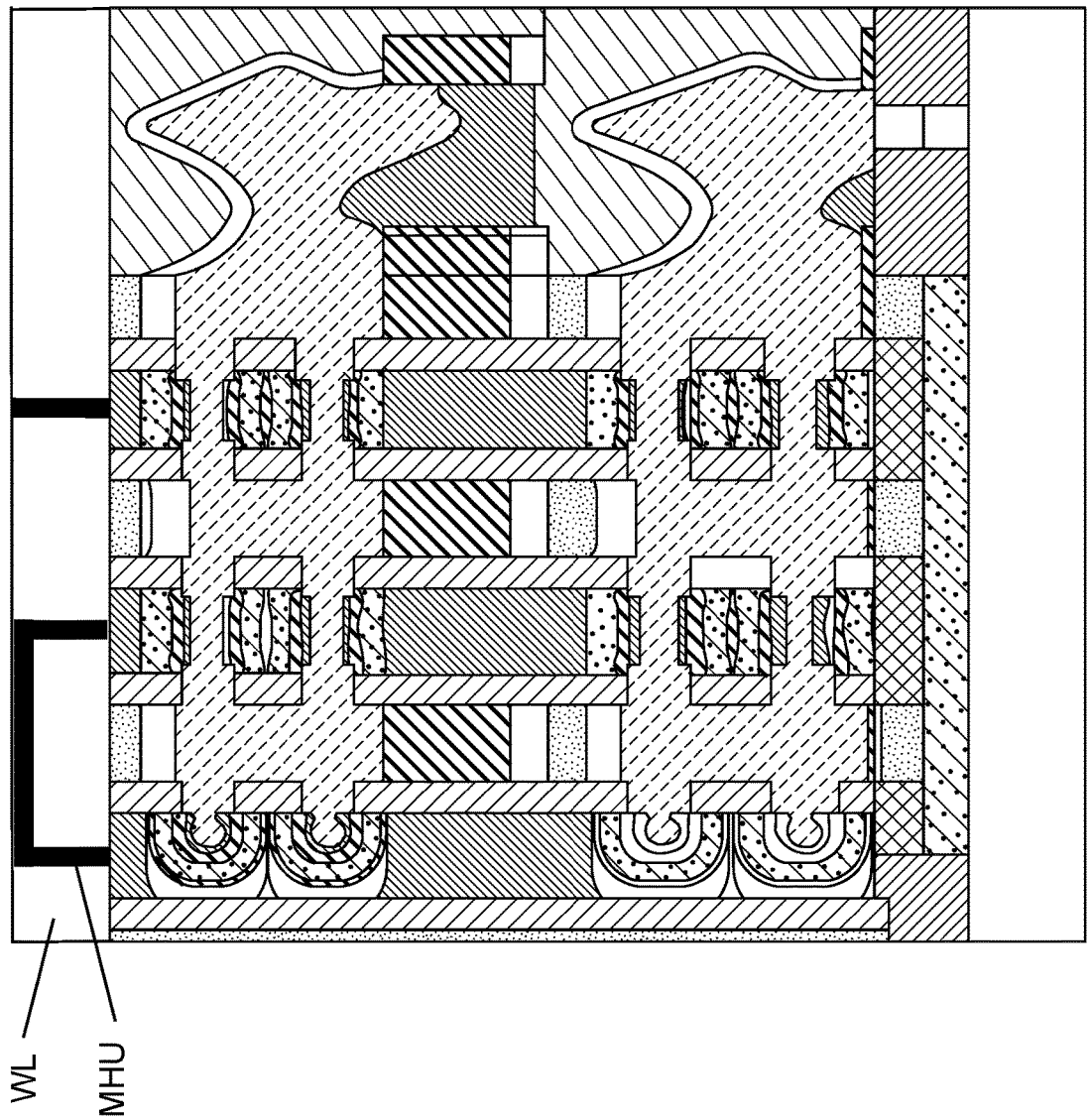
Figure 14:
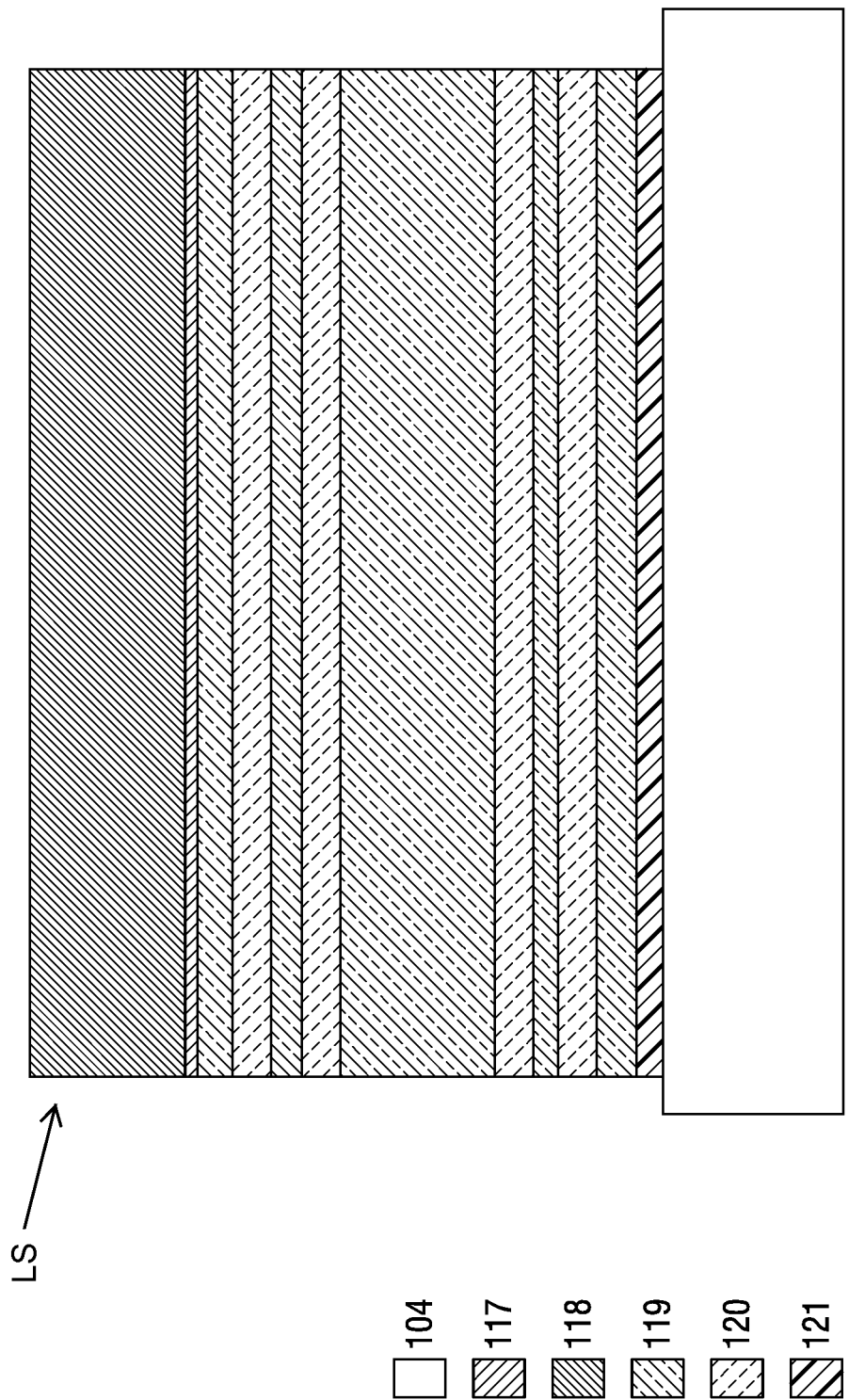
FIGS. 14-22 show a process flow for forming an PMOS substrate.
Figure 15:
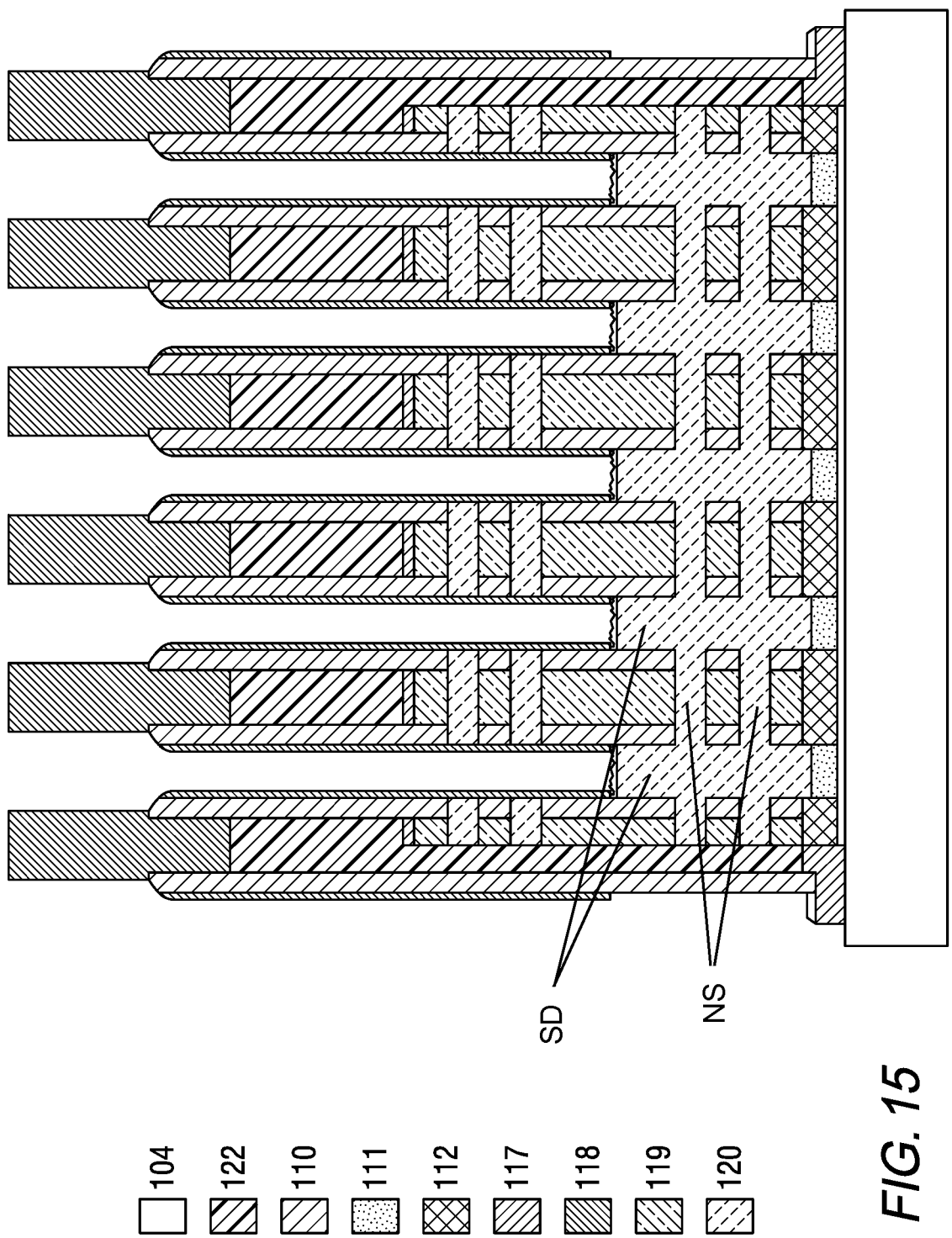
Figure 16:
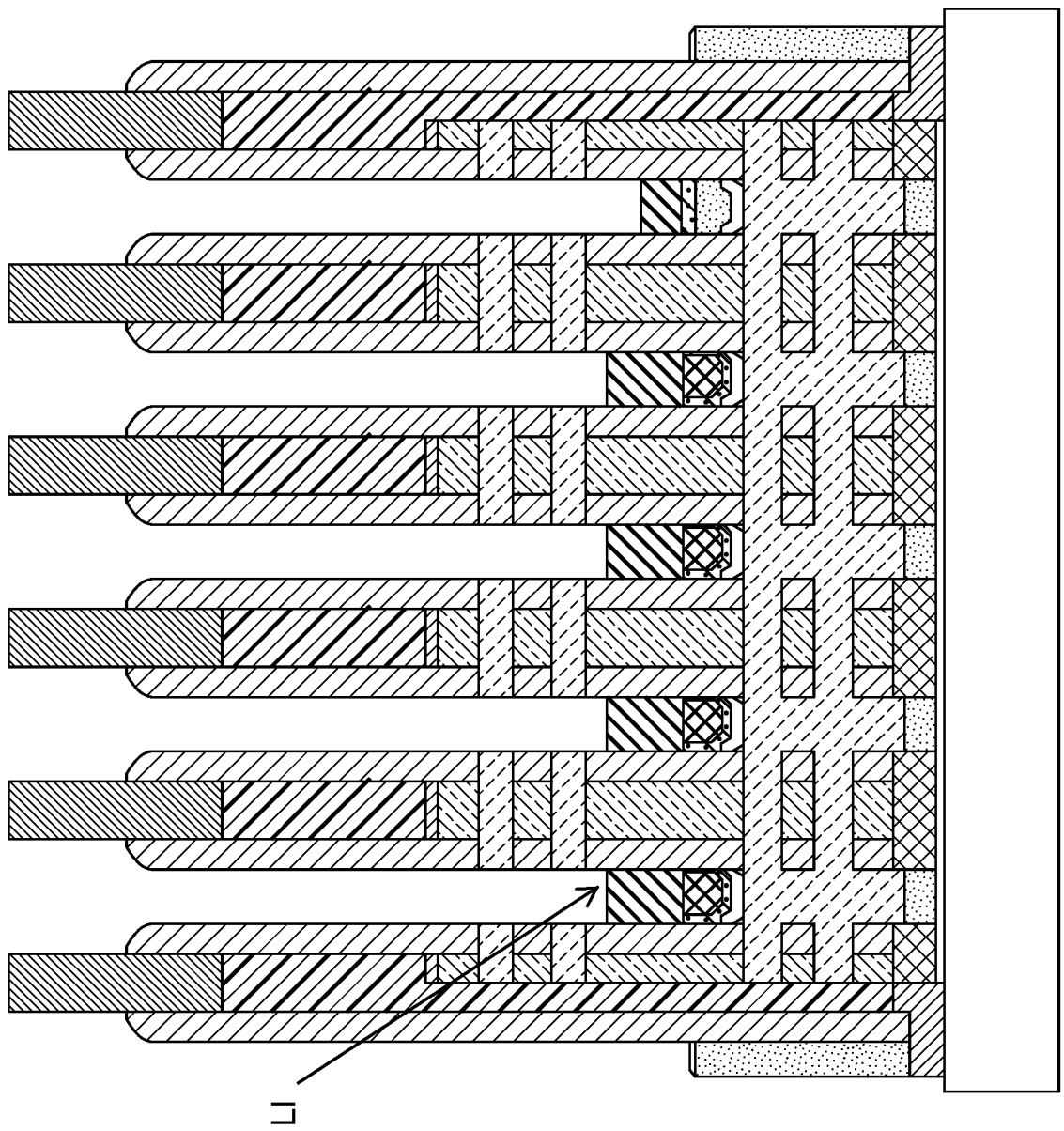
Figure 17:
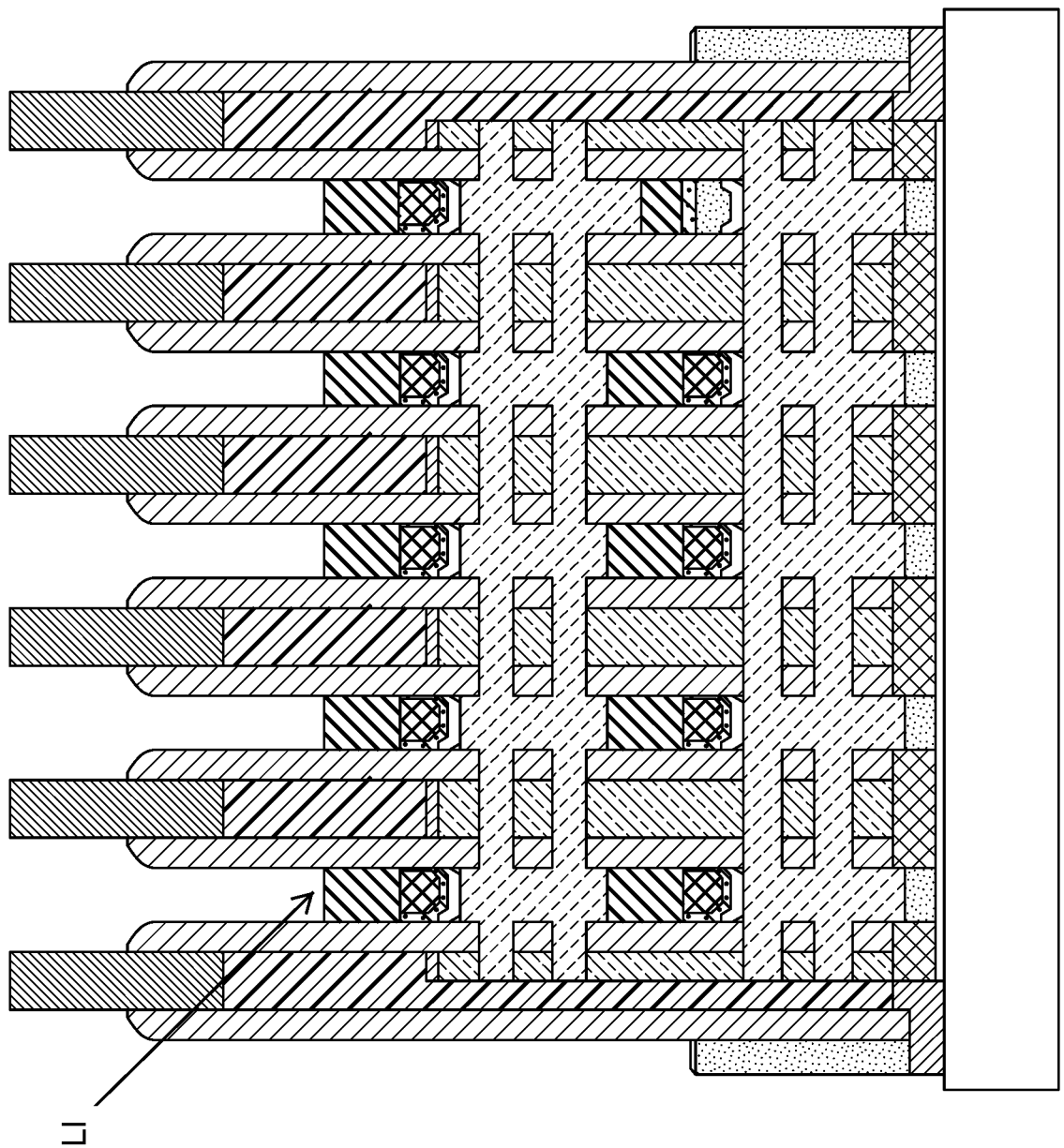
Figure 18:
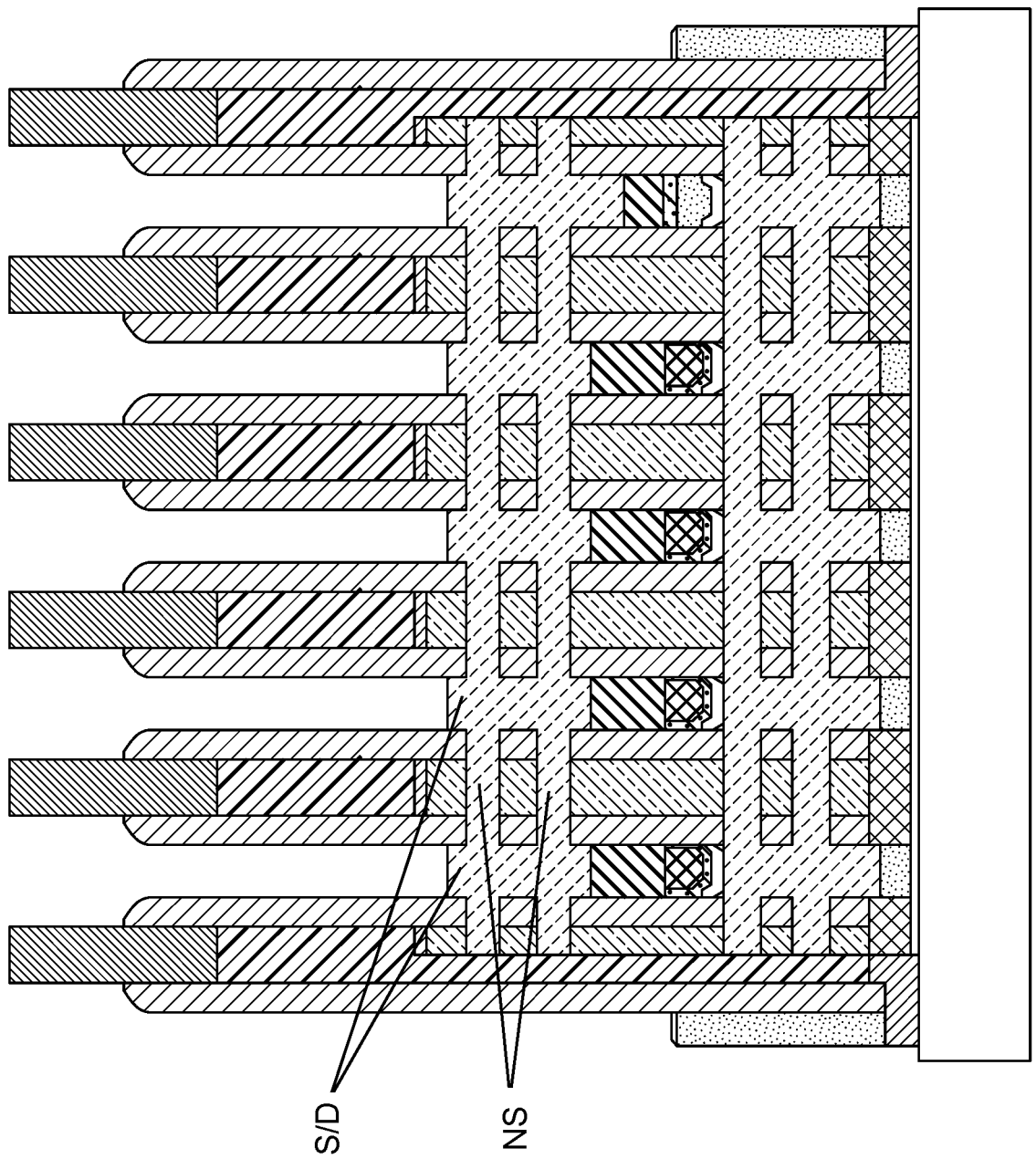
Figure 19:
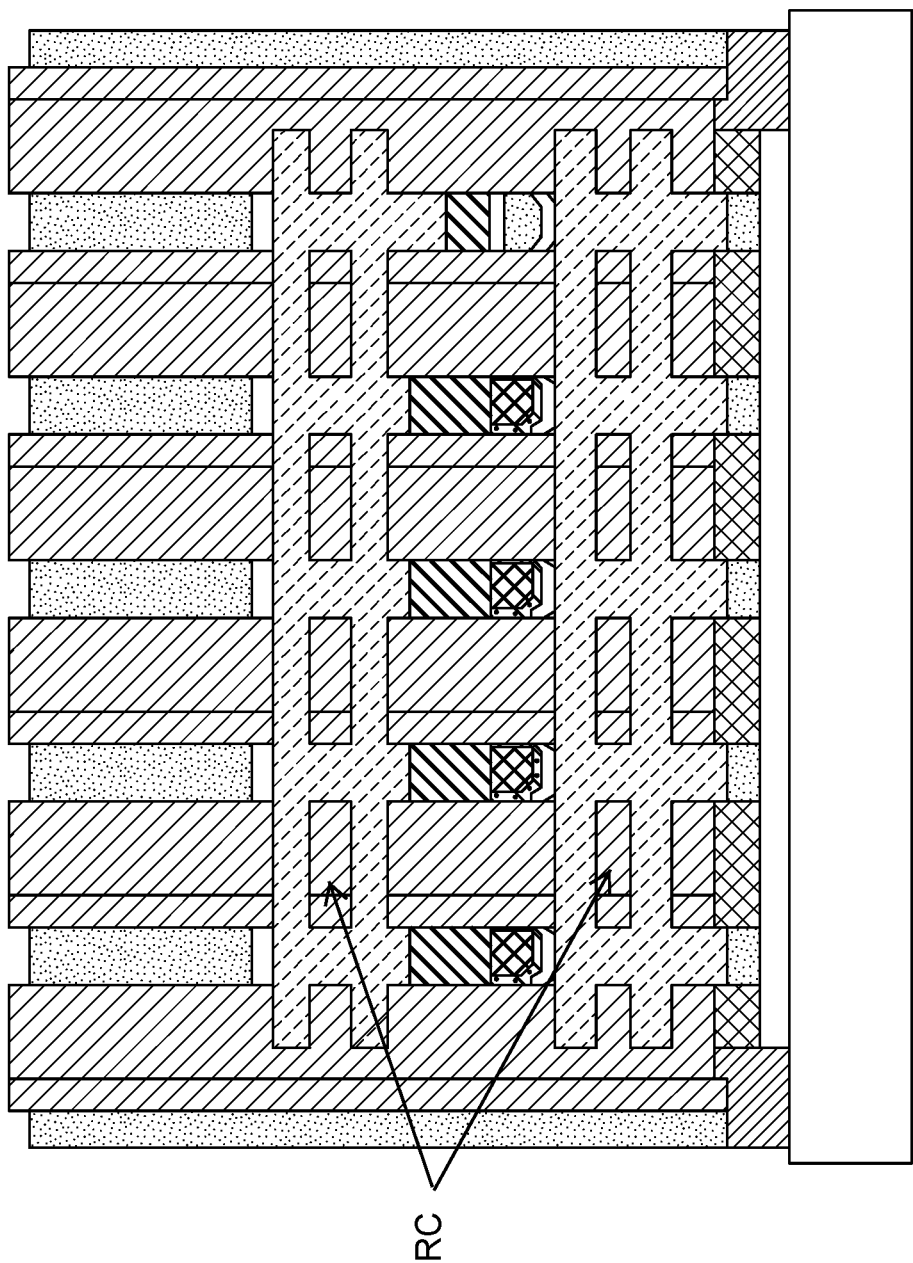
Figure 20:
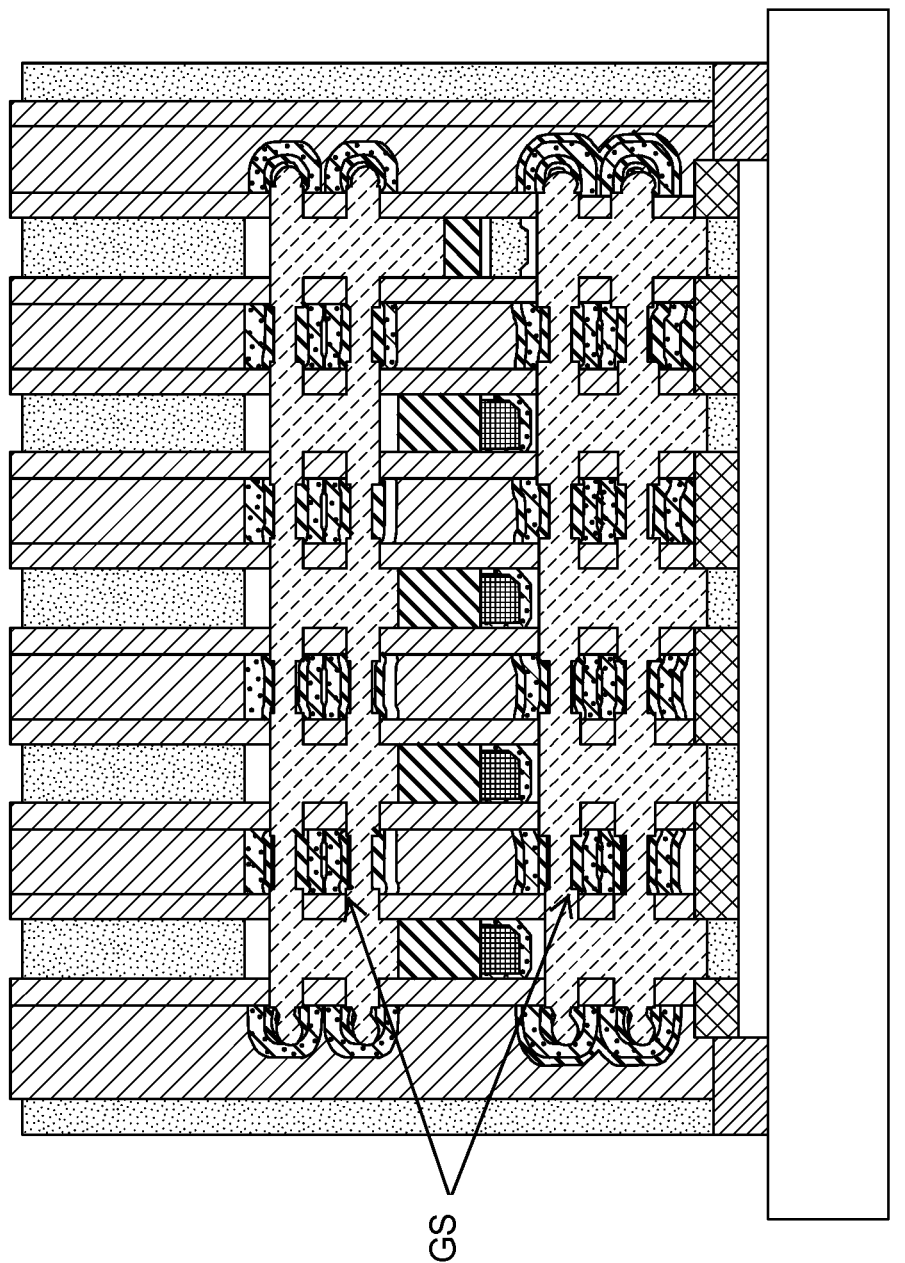
Figure 21:
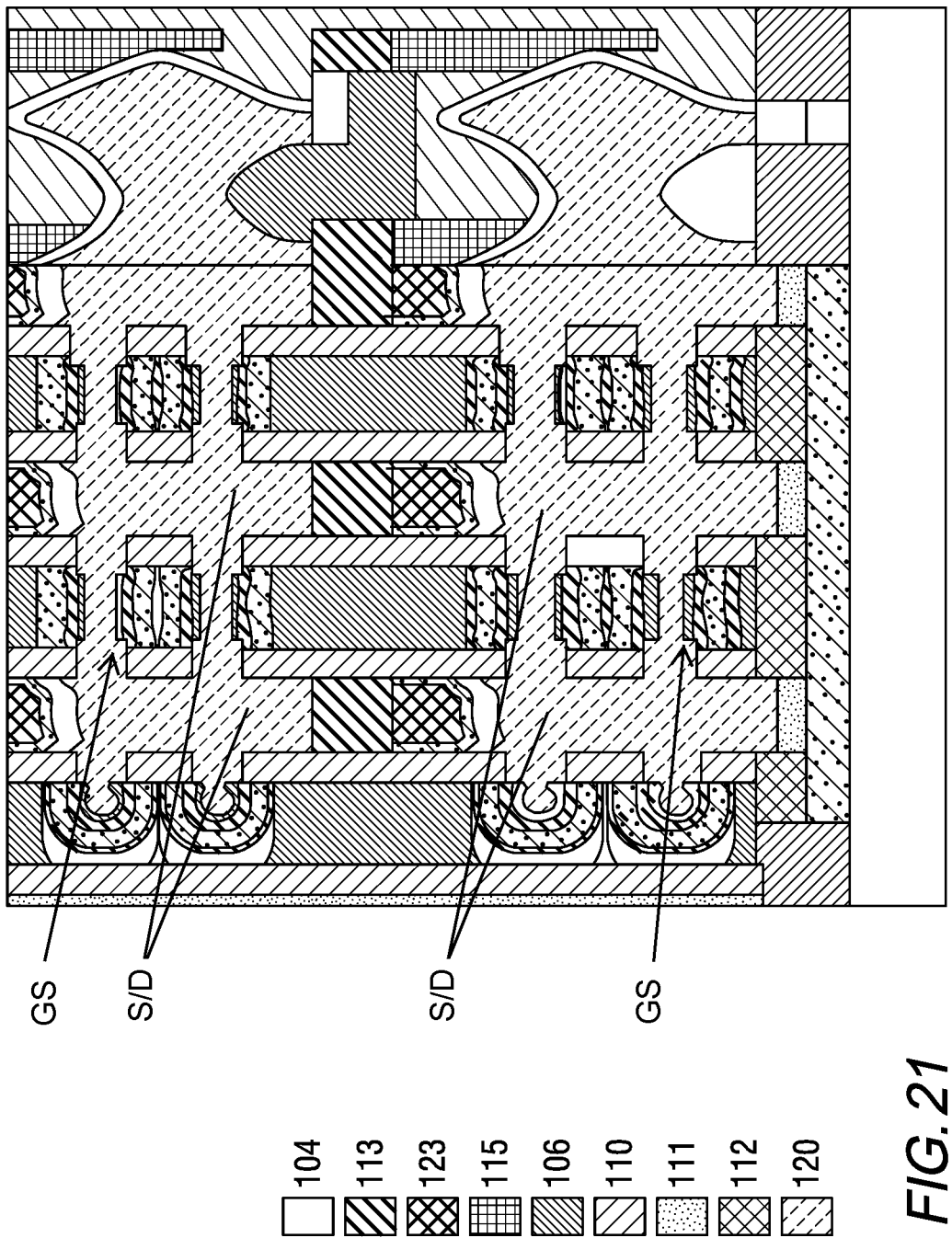
Figure 22:
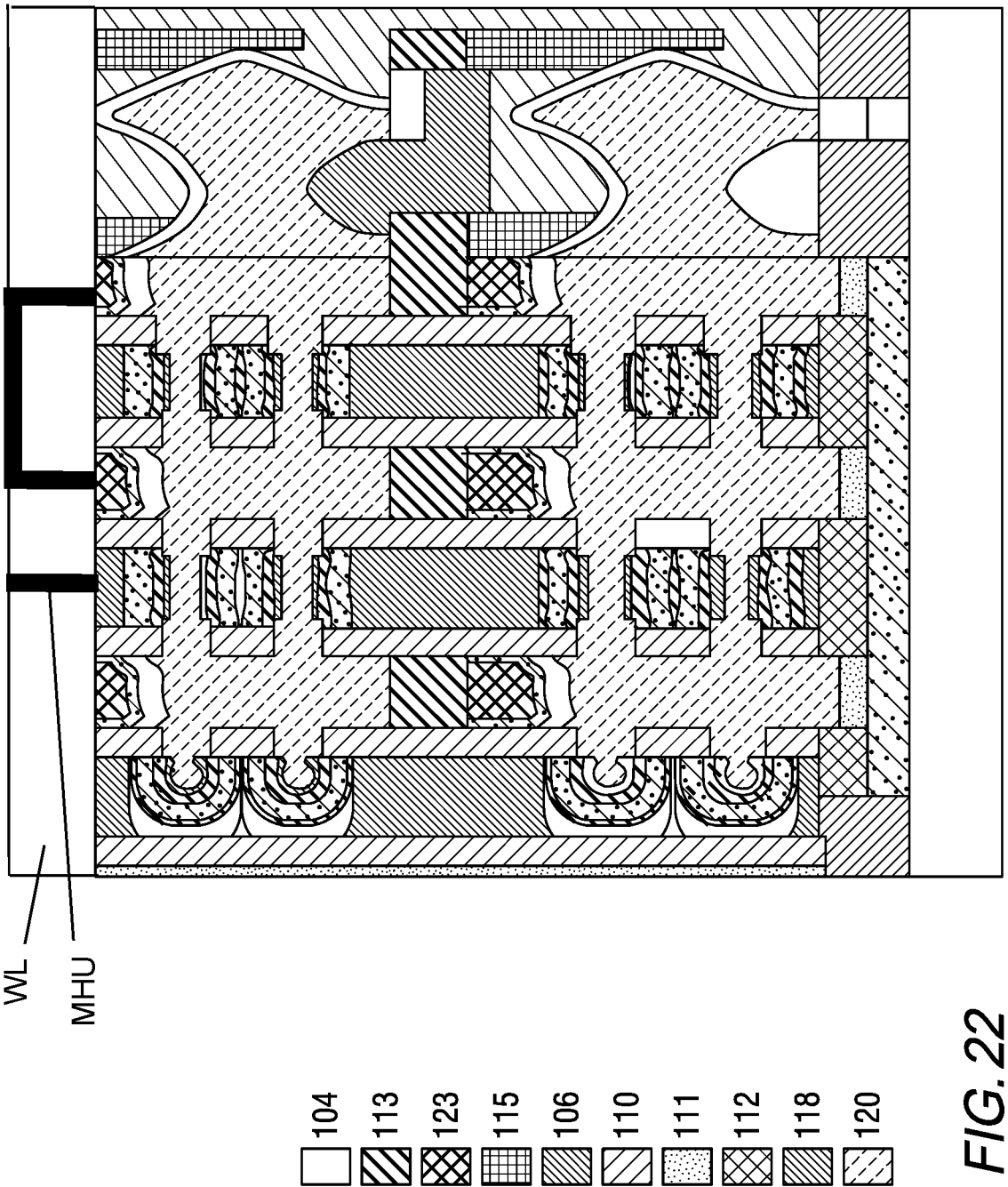

Next, a dielectric D is deposited on the substrate for forming one or more metal layers, also called wiring layers WL. Metal layers WL can be formed using conventional dual damascene process for metal hook up MHU from NMOS (FIGS. 12-13). After attached to PMOS, a completed complementary field-effect transistor (CFET) is formed.

The PMOS substrate can then be formed. FIGS. 14-22 show this process flow similar to the NMOS process flow from FIGS. 4-13. The channel material for PMOS, however, can be boron doped germanium or boron doped SiGe, and doping can be comparatively heavy. Future PMOS S/D regions and channels can have a same doping. High-k/metal deposition can include TiN, TaN, and TiAl.

Figure 23:
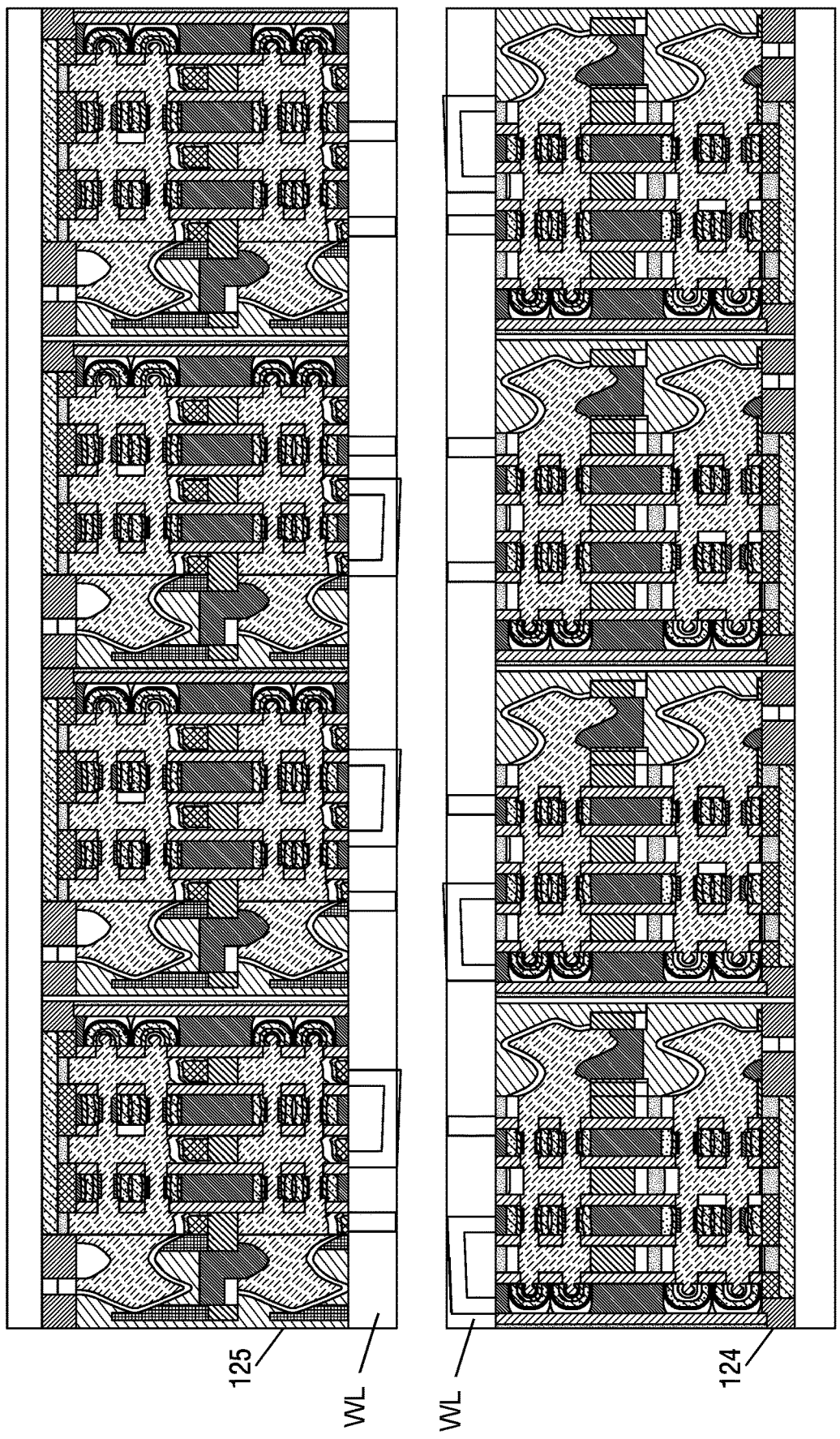
FIG. 23 shows an NMOS substrate positioned to be connected to a PMOS substrate.
Figure 24:
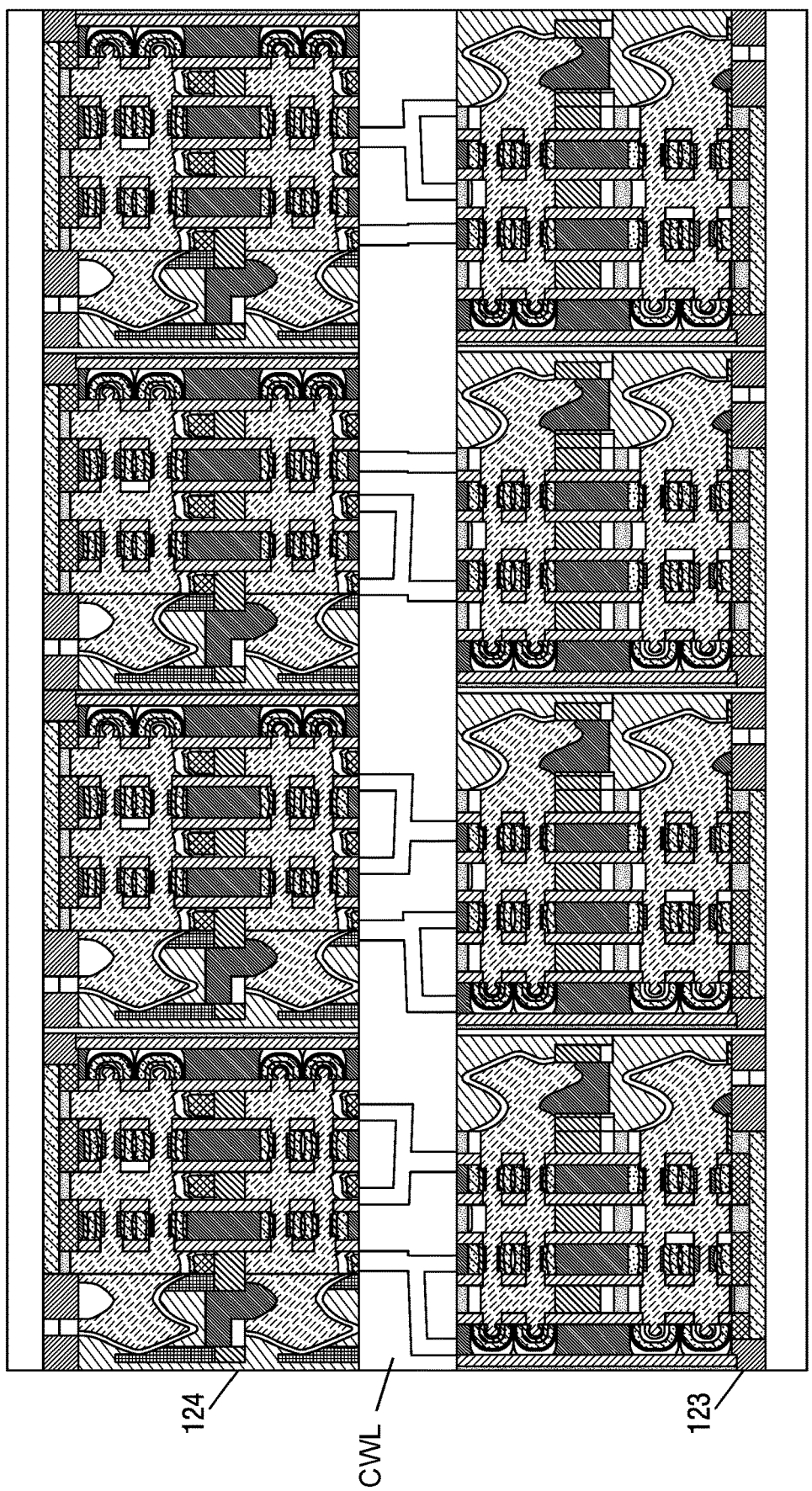
FIG. 24 shows two substrates connected after metal routing surfaces are in contact with each other.

FIG. 23 shows the NMOS substrate 124 being positioned to be connected to the PMOS substrate 125 at their respective wiring layers. The oxide layers closest to the Mx layers are bonded. Once bonding is completed, the thickness of the Ge substrate can be reduced. Metal lines from the top PMOS are connected to the bottom NMOS lines. FIG. 24 shows the two substrates 124 and 125 connected after metal routing surfaces are in contact with each other to form combined wiring layer CWL. Optionally, power rails PR can be added down the middle of the PMOS (FIG. 25). This rail can be used for ground or power to the NFET and/or PMOS. Connections can be made from FET to rail.

Accordingly, the technique described herein provides multiple 3D nano-planes having significant performance increases in IDsat (optimum drive current), speed, and lower power consumption. PMOS devices use germanium or SiGe on silicon for significant boost in circuit performance. Combining two wafers generates very high mobility optimized for NMOS and PMOS devices. Channels herein can use a same high doping level as the S/D regions, which enables shorter L devices to be made. The process flow can have N=1 to N=6 or more nano-planes. Substrate building blocks can use three blocks or more with by adding a new metal X routing layer to a bonded wafer pair. Techniques herein provide any combination of NMOS and/or PMOS stacking with improved performance.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The invention claimed is:

1. A semiconductor device comprising:
   a plurality of n-type metal-oxide-semiconductor field-effect transistor (NMOS) devices formed in a vertical NMOS stack on a first substrate;
   a first wiring plane formed over the NMOS stack on the first substrate, the first wiring plane including a first wiring layer electrically connected to the plurality of NMOS devices;
   a plurality of p-type metal-oxide-semiconductor field-effect transistor (PMOS) devices formed in a vertical PMOS stack on a second substrate;
   a second wiring plane formed over the PMOS stack on the second substrate, the second wiring plane including a second wiring layer electrically connected to the plurality of PMOS devices; and
   a bonding interface connecting the first wiring plane with the second wiring plane such that the first wiring layer of the first wiring plane is in contact with the second wiring layer of the second wiring plane and the first substrate and the second substrate form a combined substrate with the plurality of NMOS devices electrically connected to the plurality of PMOS devices.

2. The semiconductor device of claim 1, further comprising a third substrate bonded to the combined substrate, the third substrate comprising at least one additional NMOS device.

3. The semiconductor device of claim 2, wherein the third substrate is bonded to the combined substrate via a third wiring plane added to at least one side of the combined substrate.

4. The semiconductor device of claim 1, further comprising a third substrate bonded to the combined substrate, the third substrate comprising at least one additional PMOS device.

5. The semiconductor device of claim 4, wherein the third substrate is bonded to the combined substrate via a third wiring plane added to at least one side of the combined substrate.

6. The semiconductor device of claim 1, wherein the NMOS devices and PMOS devices each have a gate stack formed in a gate-all-around configuration.

7. The semiconductor device of claim 1, wherein each of the NMOS devices comprise a channel region and source/drain (S/D) regions having a common doping profile.

8. The semiconductor device of claim 1, wherein each of the NMOS devices comprises source/drain (S/D) regions which are doped and a corresponding channel region that is undoped.

9. The semiconductor device of claim 1, wherein each of the PMOS devices comprise a channel region and source/drain (S/D) regions having a common doping profile.

10. The semiconductor device of claim 1, wherein each of the PMOS devices comprise a germanium-containing channel material.

11. The semiconductor device of claim 1, wherein the NMOS and PMOS devices comprise a transistor having a channel region comprising a plurality of nanosheets.

12. The semiconductor device of claim 1, wherein the combined substrate forms a complementary field effect transistor (CFET) comprising one of the NMOS devices electrically connected to a respective one of the PMOS devices by way of the contact between the first and second metal surfaces.

* * * * *